United States Patent
Ko et al.

(10) Patent No.: US 9,563,000 B2
(45) Date of Patent: Feb. 7, 2017

(54) POLARIZING PLATE FOR OLED AND OPTICAL DISPLAY INCLUDING THE SAME

(71) Applicant: CHEIL INDUSTRIES INC., Gumi-si, Gyeongsangbuk-do (KR)

(72) Inventors: Mun Bo Ko, Uiwang-si (KR); Ki Ho Park, Uiwang-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 0 days.

(21) Appl. No.: 14/226,446

(22) Filed: Mar. 26, 2014

(65) Prior Publication Data
US 2014/0293420 A1 Oct. 2, 2014

(30) Foreign Application Priority Data
Mar. 29, 2013 (KR) .................. 10-2013-0034797

(51) Int. Cl.
*G02B 5/30* (2006.01)
*H01L 51/52* (2006.01)

(52) U.S. Cl.
CPC .......... *G02B 5/3083* (2013.01); *H01L 51/5281* (2013.01); *G02B 5/3025* (2013.01)

(58) Field of Classification Search
CPC .............. G02B 5/3025–5/3058; G02B 5/3083; G02B 1/105; G02B 1/14–1/18; H01L 51/5281; H01L 51/5293; G02F 1/1335; G02F 1/133528; G02F 1/133531; G02F 1/133541–1/133548
USPC ........................................ 359/489.01, 489.07
See application file for complete search history.

(56) References Cited

U.S. PATENT DOCUMENTS

| 7,602,462 | B2 | 10/2009 | Koishi et al. |
| 2006/0246231 | A1* | 11/2006 | Koishi ............... C09K 19/3852 428/1.3 |
| 2007/0206282 | A1* | 9/2007 | Miyatake ........... C09K 19/3852 359/487.02 |
| 2008/0252973 | A1* | 10/2008 | Akari .................... G02B 5/3033 359/485.01 |
| 2011/0222155 | A1 | 9/2011 | Sakai et al. |

FOREIGN PATENT DOCUMENTS

| CN | 1763608 A | 4/2006 |
| CN | 1954244 A | 4/2007 |

(Continued)

OTHER PUBLICATIONS

KIPO Office action dated Apr. 30, 2015 in priority application No. KR 10-2013-0034797, 2 pages.

(Continued)

*Primary Examiner* — Stephone B Allen
*Assistant Examiner* — Adam W Booher
(74) *Attorney, Agent, or Firm* — Lewis Roca Rothgerber Christie LLP (57) ABSTRACT

A polarizing plate for an OLED includes a polarizer, a protective film on an upper side of the polarizer, and a stack structure of a λ/4 reverse dispersion retardation film and a positive C plate on a lower side of the polarizer. An optical display includes the polarizing plate. The polarizing plate minimizes the difference in retardation at all lateral viewing angles, and can therefore reduce or suppress lateral color shift causing the viewer to see different colors, depending on the lateral viewing angle.

16 Claims, 8 Drawing Sheets

(56) References Cited

FOREIGN PATENT DOCUMENTS

| JP | 2012-032418 A | 2/2012 |
| JP | 2012-247494 A | 12/2012 |
| KR | 10-2007-0088269 A | 8/2007 |
| KR | 10-2008-0059832 A | 7/2008 |
| KR | 10-2010-0037658 | 4/2010 |

OTHER PUBLICATIONS

KIPO Office action dated Nov. 25, 2016, issued in KR Application No. 10-2013-0034797, with English translation, 7 pages.
SIPO Office action dated Nov. 10, 2015 issued in corresponding CN Application No. 201410124090.5, with English translation, 12 pages.
KIPO Office action dated May 31, 2016 issued in priority KR Application No. 10-2013-0034797, with machine translation, 10 pages.

* cited by examiner

------- Absorption axis of a retardation film of Example 1

_____ Transmission axis of a retardation film of Example 1

FIG. 6

------- Absorption axis of a retardation film of Comparative Example 1

———— Transmission axis of a retardation film of Comparative Example 1

POLARIZING PLATE FOR OLED AND OPTICAL DISPLAY INCLUDING THE SAME

CROSS-REFERENCE TO RELATED APPLICATION

This patent application claims priority to and the benefit of Korean Patent Application No. 10-2013-0034797, filed on Mar. 29, 2013, in the Korean Intellectual Property Office, the entire contents of which are hereby incorporated by reference.

BACKGROUND

1. Field

The following description relates to a polarizing plate for organic light emitting diodes (OLEDs) and an optical display including the same.

2. Description of the Related Art

In an organic light emitting diode (OLED) display, light emitted from a self-luminous material and external natural light (external light) reflected by an internal reflector of the OLED display interfere with each other and may deteriorate the performance of the OLED display. To suppress such interference, the OLED display usually includes a polarizing plate.

Generally, in a polarizing plate for OLEDs, a polarizer and a retardation compensation film are inclined and aligned with each other such that an absorption axis of the polarizer and an optical axis (absorption axis) of the retardation compensation film form a certain angle with each other. This alignment enables the polarizing plate of the OLED to rotate a waveform of external light reflected by the internal reflector of the OLED display, thereby serving as an anti-reflective filter. However, the alignment between the absorption axis of the polarizer and the optical axis of the retardation compensation film is asymmetric and can cause lateral color shift during operation of the OLED.

In an attempt to mitigate such lateral color shift, a structure has been proposed, in which the polarizing plate includes two retardation films, a biaxially stretched retardation compensation film, and a λ/4 reverse dispersion film of a polycarbonate material, or a liquid crystal-type retardation compensation film. However, this structure still does not sufficiently suppress lateral color shift. As the angle of incidence of external light coming from the front of the OLED display increases, then depending on the viewing angle, color may change into blue or violet, or reflectance of the polarizing plate may increase. These changes are at least in part due to the phase retardation of RGB (Red Green Blue) which occurs due to the difference between the light path of lateral external light and the light path of external light coming from the front of the OLED display.

SUMMARY

In accordance with one or more aspects of embodiments of the present invention, a polarizing plate for an OLED may include: a polarizer; a protective film on a first side (e.g. an upper side) of the polarizer; and a stack structure of a λ/4 reverse dispersion retardation film and a positive C plate on a second side (e.g. a lower side) of the polarizer.

In accordance with another aspect of embodiments of the present invention, an optical display may include the polarizing plate.

DETAILED DESCRIPTION

Embodiments of the present invention will be described with reference to the accompanying drawings. It should be understood that the present invention may be embodied in different ways and is not limited to the following embodiments. In the drawings, portions not necessary for understanding the invention are omitted for clarity. Like components will be denoted by like reference numerals throughout the specification.

As used herein, directional terms such as "upper" and "lower" are defined with reference to the accompanying drawings. Thus, it will be understood that the term "upper" can be used interchangeably with the term "lower". It will be understood that when a layer is referred to as being "on" another layer, the layer can be directly on the other layer, or an intervening layer(s) may also be present. On the other hand, when a layer is referred to as being "directly on" another layer, an intervening layer(s) is not present. The term "(meth)acrylate" may refer to acrylates and/or methacrylates. Expressions such as "at least one of" and "one of," when preceding a list of elements, modify the entire list of elements and do not modify the individual elements of the list. Further, the use of "may" when describing embodiments of the present invention refers to "one or more embodiments of the present invention."

Figure 1:
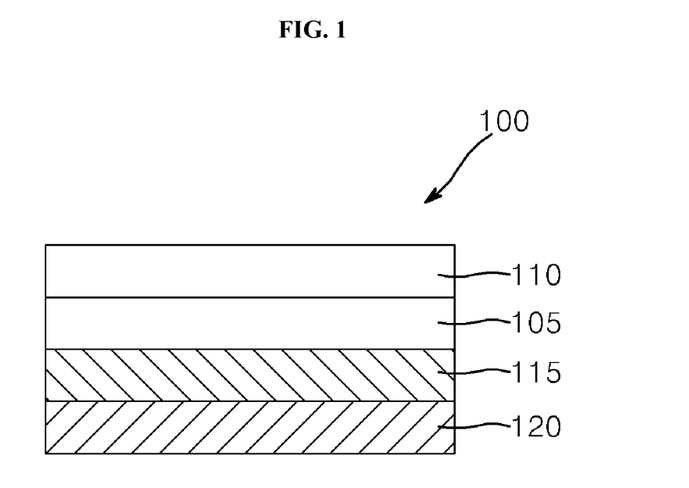
FIG. 1 is a cross-sectional view of a polarizing plate for an OLED according to one embodiment of the present invention.

In accordance with one aspect of embodiments of the present invention, a polarizing plate for an OLED may include: a polarizer; a protective film on a first side (e.g. an upper side) of the polarizer; and a stack structure of a λ/4 reverse dispersion retardation film and a positive C plate on a second side (e.g. a lower side) of the polarizer. Hereinafter, the polarizing plate for an OLED according to one embodiment will be described with reference to FIG. 1. FIG. 1 is a cross-sectional view of a polarizing plate for an OLED according to one embodiment of the invention.

Referring to FIG. 1, a polarizing plate 100 for an OLED may include: a polarizer 105; a protective film 110 on an upper surface of the polarizer 105; a λ/4 reverse dispersion retardation film 115 on a lower surface of the polarizer 105; and a positive C plate 120 on a lower surface of the λ/4 reverse dispersion retardation film 115.

In some embodiments, the polarizing plate 100 includes a stack structure of the λ/4 reverse dispersion retardation film and the positive C plate (the "stack structure"), and, although not shown in FIG. 1, the stack structure may be stacked on an OLED panel via an adhesive layer. The adhesive layer may be formed of typical adhesives, for example, (meth)acrylic adhesives, but the adhesive layer is not limited thereto.

In some embodiments, the stack structure, unlike the λ/4 reverse dispersion retardation film alone, minimizes the difference in retardation at all lateral viewing angles, and can therefore reduce or suppress lateral color shift causing the viewer to see different colors, depending on the lateral viewing angle. In other words, the positive C plate can minimize the difference in retardation generated when an optical axis (absorption axis) of the λ/4 reverse dispersion retardation film and an absorption axis of the polarizer are inclined to form a certain angle, and thus can mitigate the effects of lateral color shift.

In embodiments where the polarizing plate is stacked on the OLED panel, when a front viewing angle is defined as 0°, and left and right lateral viewing angles with respect to the front viewing angle are denoted by '−' and '+', respectively, the stack structure may have front retardation (Ro) at a wavelength of 550 nm of about 130 nm to about 145 nm with respect to the transmission axis of the λ/4 reverse dispersion retardation film at lateral viewing angles between −75° and 0° and between 0° and +75°. In addition, the stack structure may have Ro at a wavelength of 550 nm of about 145 nm to about 165 nm with respect to the absorption axis of the λ/4 reverse dispersion retardation film at lateral viewing angles between −75° and 0° and between 0° and +75°.

In some embodiments, the stack structure has a front retardation (Ro) at a wavelength of 550 nm of about 144.4 nm to about 150 nm, and in some embodiments of about 144.4 nm to about 145 nm. Within these ranges, the polarizing plate can mitigate the effects of lateral color shift.

The stack structure may have an out-of-plane retardation (Rth$_A$) at a wavelength of 550 nm of about 0 nm to about 300 nm, as calculated using Equation 1, and a degree of biaxiality (Nz$_A$) at a wavelength of 550 nm of about 0.8 or less, as calculated using Equation 2. Within these ranges, the polarizing plate can mitigate the effects of lateral color shift.

$$Rth_A = ((nx_A + ny_A)/2 - nz_A) \times d_A \quad \text{Equation 1}$$

$$Nz_A = (nx_A - nz_A)/(nx_A - ny_A) \quad \text{Equation 2}$$

In Equations 1 and 2, $nx_A$, $ny_A$ and $nz_A$ are the refractive indices in x-, y- and z-axis directions, respectively, at a wavelength of 550 nm, and $d_A$ is a thickness of the stack structure in nm.

In some embodiments, the stack structure has Rth$_A$ of about 0 nm to about 150 nm and Nz$_A$ of about 0.5 to about 0.8, and in some embodiments Rth$_A$ of about 0 nm to about 30 nm, and Nz$_A$ of about 0.6 to about 0.7, at a wavelength of 550 nm.

The stack structure may have a length in the x-axis direction (MD, machine direction corresponding to a length direction of the λ/4 reverse dispersion retardation film thereof, a width in the y-axis direction (TD, transverse direction) corresponding to a width direction of the λ/4 reverse dispersion retardation film thereof, and a thickness in the z-axis direction corresponding to a thickness direction of the λ/4 reverse dispersion retardation film thereof.

In the stack structure, the λ/4 reverse dispersion retardation film may be bonded to the positive C plate via a bonding layer. The bonding layer may be formed of an acrylic bonding agent or the like, without being limited thereto.

The stack structure may have a thickness of about 5 μm to about 100 μm. Within this range, the stack structure can be applied to the polarizing plate.

The polarizer 105 may include any suitable polarizer having polarization capabilities. In one embodiment, the polarizer 105 may be a linear polarizer, which is prepared by adsorption and alignment of a dichroic material to a polyvinyl alcohol resin, and is capable of absorbing a linearly polarized light component having an oscillation plane in a first direction and transmitting a linearly polarized light component having an oscillation plane in a second direction orthogonal to the first direction. The dichroic material may include iodine and dichroic organic dyes. In some embodiments, the polarizer 105 may be prepared by uniaxial stretching of a polyvinyl alcohol resin film, followed by dyeing the film with a dichroic material, and followed by boric acid treatment.

The polarizer 105 may have a thickness of about 4 μm to about 30 μm.

The protective film 110 may be any suitable transparent resin film, without limitation. In one embodiment, the protective film 110 may be formed of at least one of cellulose, such as triacetyl cellulose or the like, polyester, cyclic polyolefin, polycarbonate, polyethersulfone, polysulfone, polyamide, polyimide, polyolefin, polyarylate, polyvinyl alcohol, polyvinyl chloride, or polyvinylidene chloride films.

In some embodiments, the protective film 110 has a thickness of about 5 μm to about 100 μm, and in some embodiments of about 5 μm to about 80 μm. Within these ranges, the protective film 110 can be stacked on the polarizing plate.

The protective film 110 may be stacked on the polarizer via a bonding layer. In one embodiment, the bonding layer may be formed of a water-based bonding agent, a pressure-sensitive bonding agent, or a UV curable bonding agent. For example, the bonding layer may be formed of a water-based polyvinyl alcohol bonding agent, but the bonding layer is not limited thereto.

The polarizing plate 100 may further include a functional layer on one surface of the protective film 110, for example, on an upper surface of the protective film. The functional layer may be a hard coating layer, an anti-reflective layer, or the like. In some embodiments, the hard coating layer improves hardness of the protective film and thus, can improve hardness of the polarizing plate. In one embodiment, the functional layer may have a thickness of about 1 μm to about 50 μm.

The λ/4 reverse dispersion retardation film 115 may be any suitable film which has an in-plane retardation of λ/4 and exhibits reverse dispersion. Herein, the term "reverse dispersion" means a trend by which front retardation (Ro) or biaxiality (Nz) at a wavelength ranging from 380 nm to 780 nm increases as the wavelength increases, relative to the front retardation (Ro) or Nz at a reference wavelength. The reference wavelength may be 550 nm.

In some embodiments, the λ/4 reverse dispersion retardation film 115 is bonded to the polarizer and thus can provide anti-reflective filter capabilities for OLEDs.

The λ/4 reverse dispersion retardation film 115 may have a front retardation (Ro) at a wavelength of 550 nm of about 100 nm to about 200 nm, an out-of-plane retardation ($Rth_B$) at a wavelength of 550 nm of about 0 nm to about 300 nm, as calculated using Equation 3, a degree of biaxiality ($Nz_B$) at a wavelength of 550 nm of about 0.8 to about 1.2, as calculated using Equation 4, and an in-plane retardation ($Re_B$) at a wavelength of 550 nm of about 100 nm to about 200 nm, as calculated using Equation 5.

$$Rth_B = ((nx_B + ny_B)/2 - nz_B) \times d_B \qquad \text{Equation 3}$$

$$Nz_B = (nx_B - nz_B)/(nx_A - ny_B) \qquad \text{Equation 4}$$

$$Re_B = (nx_B - ny_B) \times d_B \qquad \text{Equation 5}$$

In Equations 3-5, $nx_B$, $ny_B$ and $nz_B$ are the refractive indices in x-, y- and z-axis directions, respectively, at a wavelength of 550 nm, and $d_B$ is the thickness of the λ/4 reverse dispersion retardation film in nm.

The λ/4 reverse dispersion retardation film may have a length in the x-axis direction corresponding to a length direction of the retardation film (MD, machine direction), a width in the y-axis direction corresponding to a width direction of the retardation film (TD, transverse direction), and a thickness in the z-axis direction corresponding to a thickness direction of the retardation film.

In embodiments where the polarizing plate including the λ/4 reverse dispersion retardation film is stacked on the OLED panel, when a front viewing angle is defined as 0°, and left and right lateral viewing angles with respect to the front viewing angle are denoted by '−' and '+', respectively, the λ/4 reverse dispersion retardation film may have Ro at a wavelength of 550 nm of about 45 nm to about 145 nm with respect to the transmission axis of the λ/4 reverse dispersion retardation film at lateral viewing angles between −75° and 0° and between 0° and +75°. In addition, the λ/4 reverse dispersion retardation film may have Ro at a wavelength of 550 nm of about 145 nm to about 200 nm with respect to the absorption axis of the λ/4 reverse dispersion retardation film at lateral viewing angles between −75° and 0° and between 0° and +75°.

The λ/4 reverse dispersion retardation film and the polarizer may be inclined and aligned with each other such that the absorption axis of the polarizer and the optical axis (absorption axis) of the λ/4 reverse dispersion retardation film form an angle of about 43° to about 47° or of about 133° to about 137°.

The λ/4 reverse dispersion retardation film may be stacked on the polarizer via a bonding layer. In one embodiment, the bonding layer may include a water-based bonding agent, a pressure-sensitive bonding agent, or a UV curable bonding agent. For example, the bonding layer may be formed of a water-based polyvinyl alcohol bonding agent, but the bonding layer is not limited thereto.

The λ/4 reverse dispersion retardation film may be a transparent resin film. In one embodiment, the λ/4 reverse dispersion retardation film may be formed of at least one of polycarbonate (PC), cycloolefin polymer (COP), acrylic, or cellulose resins, but the λ/4 reverse dispersion retardation film is not limited thereto.

In some embodiments, the λ/4 reverse dispersion retardation film has a thickness of about 50 μm to about 100 μm, and in some embodiments of about 50 μm to about 75 μm. Within these ranges, the λ/4 reverse dispersion retardation film can be applied to the polarizing plate.

In some embodiments, the positive C plate 120 means a positive uniaxial optical device, in which the refractive indices satisfy the following conditions: nzC>nxC=nyC. The positive C plate 120 may be a retardation film, such as a solidified or cured layer of a liquid crystal composition including a liquid crystal compound, but the positive C plate is not limited thereto.

The positive C plate may have an in-plane retardation ($Re_C$) at a wavelength of 550 nm of about 5 nm or less, as calculated using Equation 6, and an out-of-plane retardation ($Rth_C$) at a wavelength of 550 nm of about −300 nm to about 0 nm, as calculated using Equation 7:

$$Re_C = (nx_C - ny_C) \times d_C \qquad \text{Equation 6}$$

$$Rth_C = ((nx_C + ny_C)/2 - nz_C) \times d_C \qquad \text{Equation 7}$$

In Equations 6 and 7, $nx_C$, $ny_C$ and $nz_C$ are the refractive indices in x-, y- and z-axis directions, respectively, at a wavelength of 550 nm, and $d_C$ is the thickness of the positive C plate in nm.

In some embodiments, the positive C plate has $Re_C$ of about 0 nm to about 5 nm, and $Rth_C$ of about −150 nm to about −50 nm, at a wavelength of 550 nm.

In one embodiment, the positive C plate is a liquid crystal-aligned film, and may be a commercially available product or may be prepared by any suitable method that would be apparent to those of ordinary skill in the art, but the positive C plate is not limited thereto.

The positive C plate may have an x-axis direction corresponding to the direction of coating of a liquid crystal, a y-axis direction orthogonal to the direction of coating of the liquid crystal, and a z-axis direction corresponding to a thickness direction of the positive C plate.

The positive C plate may be stacked on the polarizer via a bonding layer. In one embodiment, the bonding layer may include a water-based bonding agent, a pressure-sensitive bonding agent, or a UV curable bonding agent. For example, the bonding layer may be formed of a water-based polyvinyl alcohol bonding agent, but the bonding layer is not limited thereto.

In some embodiments, the positive C plate has a thickness of about 0.1 μm to about 10 μm, and in some embodiments of about 1 μm to about 5 μm. Within these ranges, the positive C plate can be applied to the polarizing plate.

In some embodiments, the polarizing plate has a degree of polarization of about 90% or more, and in some embodiments of about 90% to about 99.99%. Within these ranges, the polarizing plate can be applied to OLED displays.

In some embodiments, the polarizing plate has a transmittance of about 38% or more, and in some embodiments of about 40% to about 49%. Within these ranges, the polarizing plate can be applied to OLED displays.

In some embodiments, the polarizing plate has a thickness of about 50 μm to about 200 μm, and in some embodiments of about 80 µm to about 130 µm. Within these ranges, the polarizing plate can effectively serve as a polarizing plate.

Figure 2:
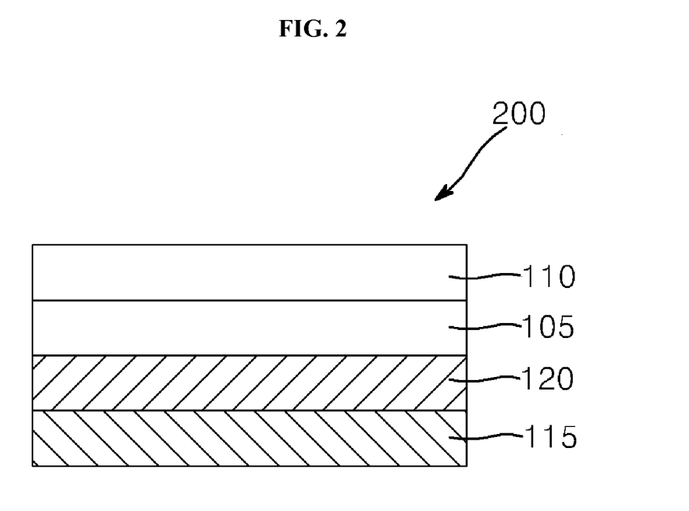
FIG. 2 is a cross-sectional view of a polarizing plate for an OLED according to another embodiment of the present invention.

Hereinafter, a polarizing plate for an OLED according to another embodiment of the present invention will be described with reference to FIG. 2. FIG. 2 is a cross-sectional view of a polarizing plate for an OLED according to another embodiment of the present invention.

Referring to FIG. 2, a polarizing plate 200 for an OLED may include: a polarizer 105; a protective film 110 on an upper surface of the polarizer 105; a positive C plate 120 on a lower surface of the polarizer 105; and a λ/4 reverse dispersion retardation film 115 on a lower surface of the positive C plate 120. The polarizing plate 200 is the same as the polarizing plate described above, except that the positive C plate 120 is on the lower surface of the polarizer 105 and the λ/4 reverse dispersion retardation film 115 is on the lower surface of the positive C plate 120.

Figure 3:
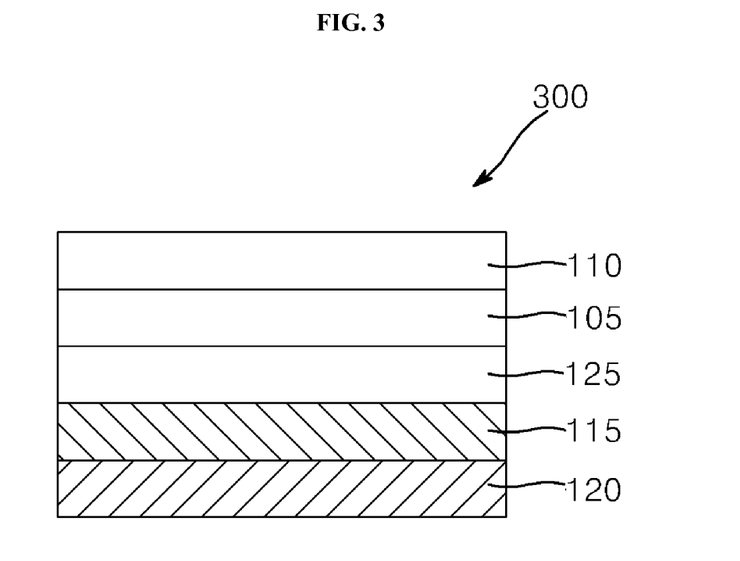
FIG. 3 is a cross-sectional view of a polarizing plate for an OLED according to a further embodiment of the present invention.

Hereinafter, a polarizing plate for an OLED according to another embodiment of the present invention will be described with reference to FIG. 3. FIG. 3 is a cross-sectional view of a polarizing plate for an OLED according to an embodiment of the present invention.

Referring to FIG. 3, a polarizing plate 300 for an OLED may include: a polarizer 105; a protective film 110 on an upper surface of the polarizer 105; an isotropic film 125 on a lower surface of the polarizer 105; a λ/4 reverse dispersion retardation film 115 on a lower surface of the isotropic film 125; and a positive C plate 120 on a lower surface of the λ/4 reverse dispersion retardation film 115. The polarizing plate 300 is the same as the polarizing plate described above, except that the isotropic film is placed between the polarizer and the λ/4 reverse dispersion retardation film.

Any suitable film capable of protecting the polarizer without affecting retardation of the λ/4 reverse dispersion retardation film and the positive C plate can be used as the isotropic film, without limitation.

In one embodiment, the isotropic film may be a non-stretched transparent film. For example, the isotropic film may be formed of at least one of cycloolefin polymer (COP), cellulose, polyester, polycarbonate, polyethersulfone, polysulfone, polyamide, polyimide, polyolefin, polyarylate, polyvinyl alcohol, polyvinyl chloride, or polyvinylidene chloride films, but the isotropic film is not limited thereto.

In one embodiment, the isotropic film has a thickness of about 5 µm to about 100 µm, and in one embodiment of about 5 µm to about 80 µm. Within these ranges, the isotropic film can be applied to the polarizing plate.

Figure 4:
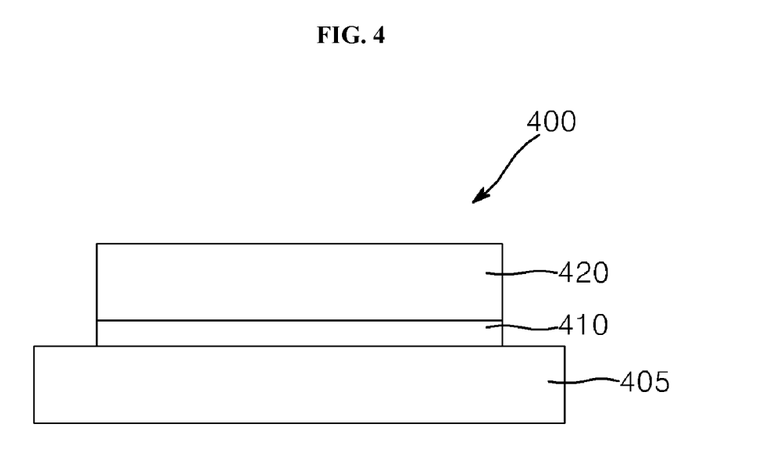
FIG. 4 is a cross-sectional view of an optical display according to one embodiment of the present invention.

In accordance with another aspect of embodiments of the present invention, an optical display may include the polarizing plate for an OLED described above. The optical display may further include an organic light emitting diode (OLED) display, but the optical display is not limited thereto. Hereinafter, an optical display according to one embodiment will be described with reference to FIG. 4. FIG. 4 is a sectional view of an optical OLED display according to one embodiment of the present invention.

Referring to FIG. 4, an OLED display 400 may include: an OLED panel 405; a polarizing plate 420 for an OLED on an upper surface of the OLED panel 405; and an adhesive layer 410 between the polarizing plate 420 and the OLED panel 405. The polarizing plate 420 may be the polarizing plate according to any one of the embodiments described above.

Hereinafter, embodiments of the present invention will be described with reference to some examples. However, it should be noted that these examples are provided for illustration only and are not to be construed in any way as limiting the present invention.

EXAMPLE 1

A polyvinyl alcohol film (PS#60, Kuraray Co., Ltd., Japan, thickness before stretching: 60 µm) was stretched to 6 times its initial length in an aqueous solution of iodine at 55° C., thereby obtaining a polarizer with a transmittance of 45%. A hard coating triacetyl cellulose (HC TAC) film (CHP2S, Dai Nippon Printing Co., Ltd., thickness: 30 µm) was bonded to an upper side of the polarizer using a polyvinyl alcohol bonding agent.

A positive C plate (NV80, JX, Re: 0 nm and Rth: −78 nm at a wavelength of 550 nm, thickness: 2 µm) was bonded to a λ/4 reverse dispersion retardation compensation film (a polycarbonate film, Teijin Co., Ltd., Re: 145 nm, Rth: 100 nm and Nz: 1.2 at a wavelength of 550 nm, thickness: 50 µm) using an acrylic bonding agent, thereby preparing a stack structure. The stack structure and the polarizer were aligned such that the optical axis (absorption axis) of the λ/4 reverse dispersion retardation compensation film and the absorption axis of the polarizer formed an angle of 45° with each other. The stack structure was then bonded to a lower side of the polarizer using an acrylic bonding agent, such that the polarizer adjoined the λ/4 reverse dispersion retardation compensation film, thereby preparing the polarizing plate of FIG. 1.

EXAMPLE 2

A polarizing plate of FIG. 2 was prepared as in Example 1 except that the polarizer adjoined the positive C plate.

COMPARATIVE EXAMPLE 1

A polyvinyl alcohol film (PS#60, Kuraray Co., Ltd., Japan, thickness before stretching: 60 µm) was stretched to 6 times its initial length in an aqueous solution of iodine at 55° C., thereby obtaining a polarizer having a transmittance of 45%. A hard coating triacetyl cellulose (HC TAC) film (CHP2S, DNP Co., Ltd., thickness: 30 µm) was bonded to an upper side of the polarizer using a polyvinyl alcohol bonding agent. A λ/4 reverse dispersion retardation compensation film (polycarbonate film, Teijin Co., Ltd., Re: 145 nm, Rth: 100 nm and Nz: 1.2 at a wavelength of 550 nm, thickness: 50 µm) was bonded to a lower side of the polarizer using an acrylic bonding agent, such that the optical axis of the λ/4 reverse dispersion retardation compensation film and the absorption axis of the polarizer formed an angle of 45° with each other, thereby preparing a polarizing plate.

COMPARATIVE EXAMPLE 2

A polyvinyl alcohol film (PS#60, Kuraray Co., Ltd., Japan, thickness before stretching: 60 µm) was stretched to 6 times its initial length in an aqueous solution of iodine at 55° C., thereby obtaining a polarizer having a transmittance of 45%. A hard coating triacetyl cellulose (HC TAC) film (CHP2S, DNP Co., Ltd., thickness: 30 µm) was bonded to an upper side of the polarizer using a polyvinyl alcohol bonding agent. A positive C plate (NV80, JX, Re: 0 nm and Rth: −78 nm at a wavelength of 550 nm, thickness: 2 µm) was bonded to a lower side of the polarizer using an acrylic bonding agent, thereby preparing a polarizing plate.

Each of the prepared polarizing plates was evaluated alone or in conjunction with an OLED panel as to the following properties. Results are shown in Table 1 and FIGS. 5 to 10.

(1) Transmittance and Degree of polarization: Transmittance and degree of polarization were measured on each of the polarizing plates using a V-7100 UV-VIS spectrophotometer (JASCO Co., Ltd., Japan).

(2) Retardation properties: Retardation properties of the 50 mm×50 mm (width×length) stack structure of the positive C plate and the λ/4 reverse dispersion retardation film, or of only the λ/4 reverse dispersion retardation film, were measured at a wavelength of 550 nm using an Axoscan tester.

(3) Reflectance and Color shift: Each of the polarizing plates was laminated on the OLED panel, and the reflectance and color shift were measured at a wavelength of 550 nm and at a predetermined range of angles, using an EZ-contrast 3D tester (Eldim Co., Ltd., France).

TABLE 1

| | Thickness of polarizing plate (μm) | Transmittance (%) | Degree of polarization (%) | Reflectance (%) | Nz | Remarks |
|---|---|---|---|---|---|---|
| Example 1 | 112 | 44.8 | 99.2 | 4.8 | 0.67 | — |
| Example 2 | 112 | 44.8 | 99.2 | 4.8 | 0.67 | — |
| Comparative Example 1 | 107 | 44.8 | 99.2 | 5.0 | 1.2 | — |
| Comparative Example 2 | 57 | 44.8 | 99.2 | 25 | 0.5 | Not having capabilities of anti-reflective filter |

Figure 5:
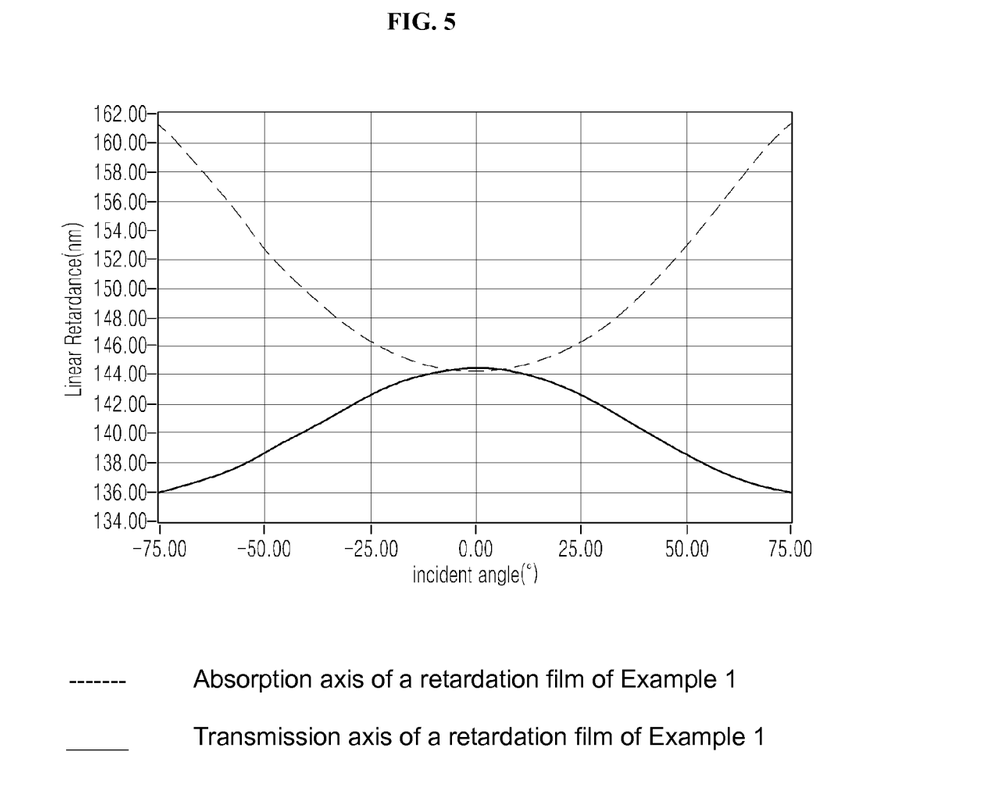
FIG. 5 is a graph illustrating front retardation (linear retardance, Ro) at a wavelength of 550 nm of a stack structure of Example 1 relative to an angle of incidence of light varying from −75° to +75° (dashed line shows retardation with respect to an absorption axis of a retardation film, solid line shows retardation with respect to a transmission axis of the retardation film).
Figure 8:
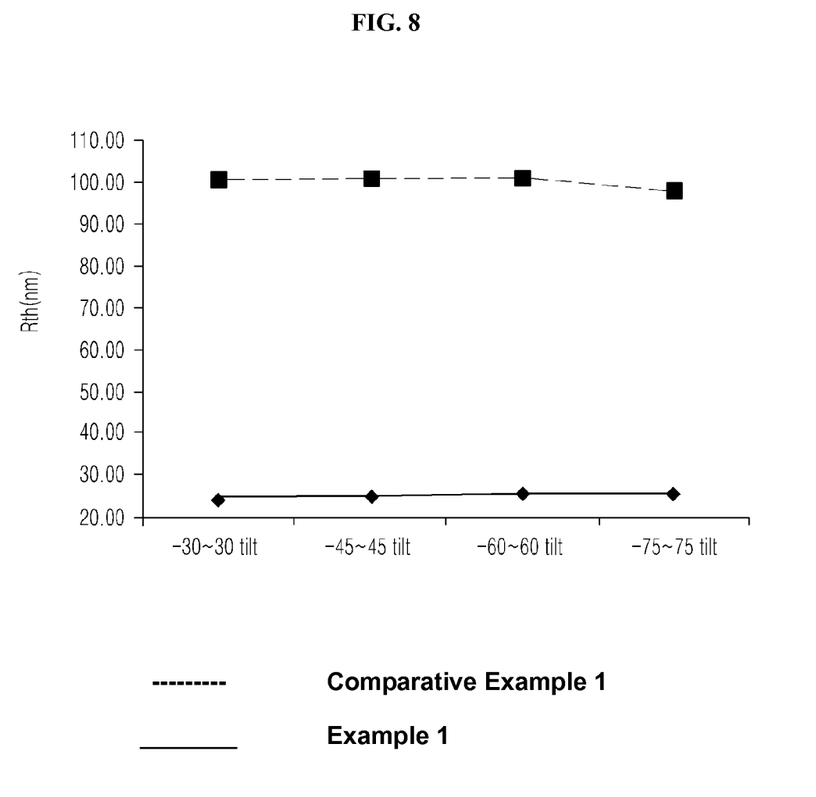
FIG. 8 is a graph depicting out-of-plane retardation (Rth) at a wavelength of 550 nm of a stack structure of Example 1 (solid line) with respect to a lateral viewing angle (unit of tilt is degree (°)), and Rth at a wavelength of 550 nm of a λ/4 reverse dispersion retardation film of Comparative Example 1 (dashed line) with respect to a lateral viewing angle (unit of tilt is degree (°)).
Figure 9:
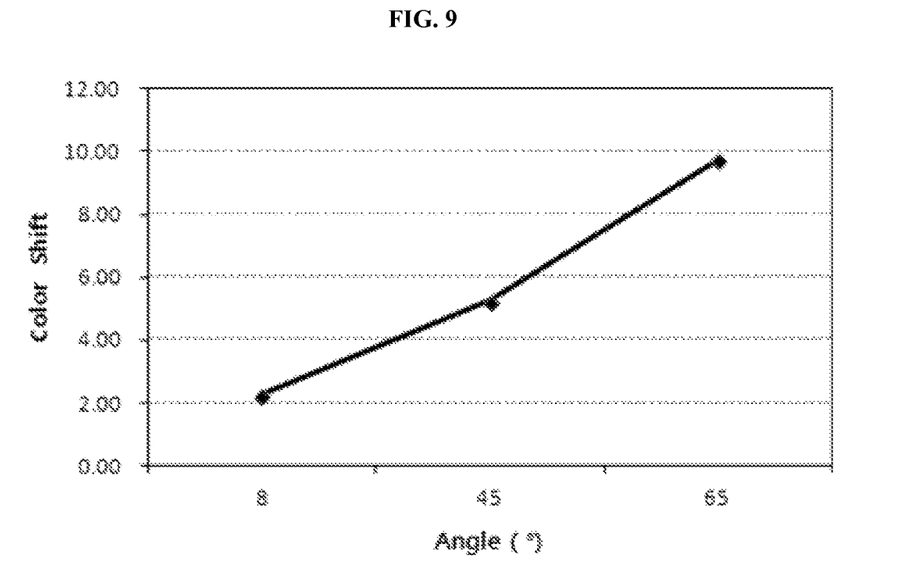
FIG. 9 is a graph illustrating the color shift of a polarizing plate of Example 1 at the lateral viewing angle.

As shown in Table 1 and FIGS. 5 to 10, the polarizing plates of Examples 1 and 2 minimized out-of-plane retardation at lateral viewing angles, as shown in FIGS. 5 and 8, and thus could minimize lateral color shift, as shown in FIG. 9. Without being bound by any particular theory, it is believed that the polarizing plates according to embodiments of the present invention can suppress lateral color shift in OLED displays that causes a variation in reflected color depending on the lateral viewing angle, and also can reduce thickness of the displays.

Figure 6:
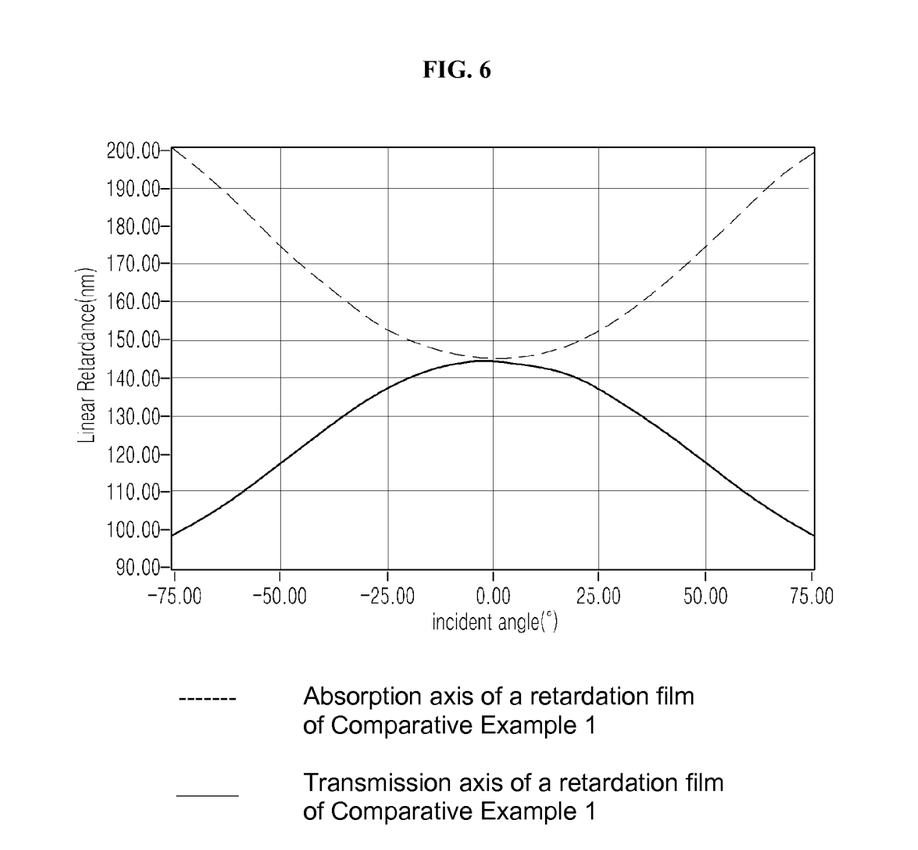
FIG. 6 is a graph illustrating front retardation (Ro) at a wavelength of 550 nm of a λ/4 reverse dispersion retardation film of Comparative Example 1 relative to an angle of incidence of light varying from −75° to +75° (dashed line shows retardation with respect to an absorption axis of a retardation film, solid line shows retardation with respect to a transmission axis of the retardation film).
Figure 7:
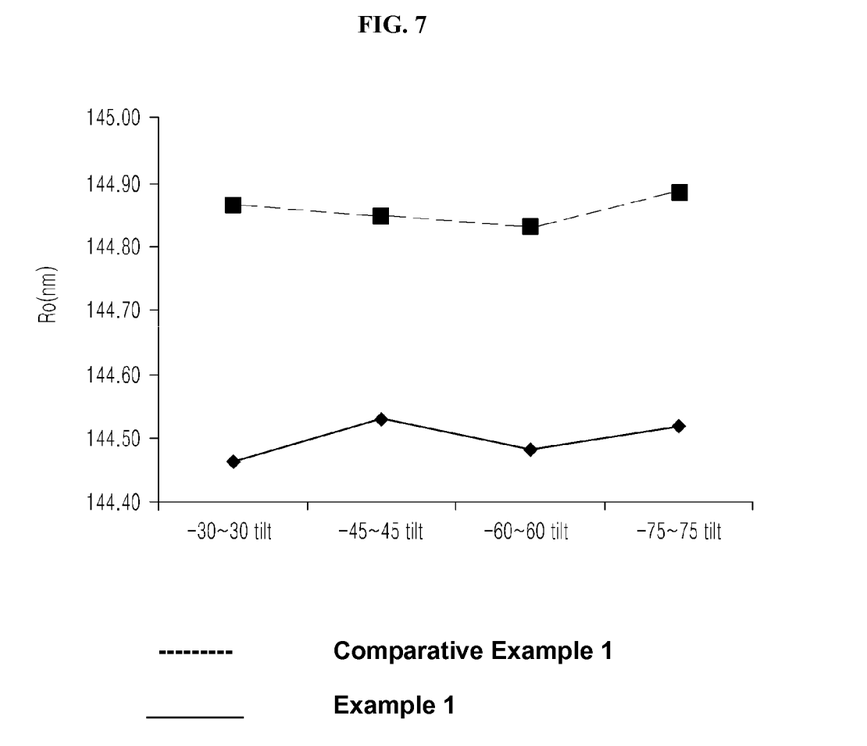
FIG. 7 is a graph illustrating Ro at a wavelength of 550 nm of a stack structure of Example 1 (solid line) with respect to a lateral viewing angle (unit of tilt is degree (°)), and Ro at a wavelength of 550 nm of a λ/4 reverse dispersion retardation film of Comparative Example 1 (dashed line) with respect to a lateral viewing angle (unit of tilt is (°)).
Figure 10:
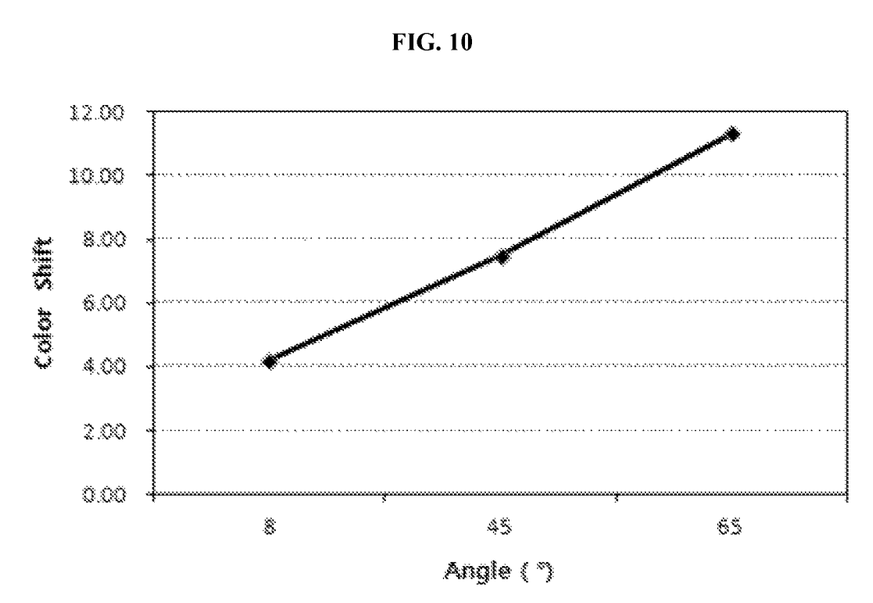
FIG. 10 is a graph depicting the color shift of a polarizing plate of Comparative Example 1 at the lateral viewing angle.

In contrast, the polarizing plate of Comparative Example 1 not including the positive C plate had significantly larger out-of-plane retardation at lateral viewing angles than the polarizing plates of Examples 1 and 2, as shown in Table 1 and FIGS. 6 and 8, and thus could cause more lateral color shift, as shown in FIG. 10.

In addition, the polarizing plate of Comparative Example 2 free from the λ/4 reverse dispersion retardation film did not have capabilities of an anti-reflective filter.

It should be understood that the invention is not limited to the disclosed embodiments and that various modifications, changes, alterations, and equivalent embodiments can be made by those skilled in the art without departing from the spirit and scope of the appended claims and equivalents thereof.

What is claimed is:

1. A polarizing plate for an organic light emitting diode (OLED) display, the polarizing plate comprising:
   a polarizer;
   a protective film on a first side of the polarizer; and
   a stack structure comprising a λ/4 reverse dispersion retardation film and a positive C plate on a second side of the polarizer,
   wherein the stack structure has a degree of biaxiality ($Nz_A$) at a wavelength of 550 nm of about 0.8 or less, as calculated using Equation 2:

$$Nz_A = (nx_A - nz_A)/(nx_A - ny_A) \quad \text{Equation 2}$$

wherein $nx_A$, $ny_A$ and $nz_A$ are refractive indices in x-, y- and z-axis directions, respectively, at a wavelength of 550 nm.

2. The polarizing plate according to claim 1, wherein the λ/4 reverse dispersion retardation film is next to the polarizer.

3. The polarizing plate according to claim 1, wherein the positive C plate is next to the polarizer.

4. The polarizing plate according to claim 1, wherein the stack structure has an out-of-plane retardation ($Rth_A$) at a wavelength of 550 nm of about 0 nm to about 300 nm, as calculated using Equation 1:

$$Rth_A = ((nx_A + ny_A)/2 - nz_A) \times d_A \quad \text{Equation 1.}$$

wherein $d_A$ is a thickness of the stack structure in nm.

5. The polarizing plate according to claim 1, wherein an absorption axis of the polarizer and an absorption axis of the λ/4 reverse dispersion retardation film form an angle of about 43° to about 47°, or of about 133° to about 137°, with each other.

6. The polarizing plate according to claim 1, wherein the stack structure has a thickness of about 5 μm to about 100 μm.

7. The polarizing plate according to claim 1, wherein the λ/4 reverse dispersion retardation film has an out-of-plane retardation ($Rth_B$) at a wavelength of 550 nm of about 0 nm to about 300 nm, as calculated using Equation 3, and a degree of biaxiality ($Nz_B$) at a wavelength of 550 nm of about 0.8 to about 1.2, as calculated using Equation 4:

$$Rth_B = ((nx_B + ny_B)/2 - nz_B) \times d_B \quad \text{Equation 3}$$

$$Nz_B = (nx_B - nz_B)/(nx_B - ny_B) \quad \text{Equation 4}$$

wherein $nx_B$, $ny_B$ and $nz_B$ are refractive indices in x-, y- and z-axis directions, respectively, at a wavelength of 550 nm and $d_B$ is a thickness of the λ/4 reverse dispersion retardation film in nm.

8. The polarizing plate according to claim 1, wherein the λ/4 reverse dispersion retardation film comprises a material selected from the group consisting of polycarbonates (PC), cycloolefin polymers (COP), acrylics, cellulose resins, and combinations thereof.

9. The polarizing plate according to claim 1, wherein the positive C plate has an in-plane retardation ($Re_c$) at a wavelength of 550 nm of about 5 nm or less, as calculated using Equation 5, and an out-of-plane retardation ($Rth_c$) at a wavelength of 550 nm of about −150 nm to about −50 nm, as calculated using Equation 6:

$$Re_c = (nx_c - ny_c) \times d_c \qquad \text{Equation 5}$$

$$Rth_c = ((nx_c + ny_c)/2 - nz_c) \times d_c \qquad \text{Equation 6}$$

wherein $nx_c$, $ny_c$ and $nz_c$ are refractive indices in x-, y- and z-axis directions, respectively, at a wavelength of 550 nm and $d_c$ is a thickness of the positive C plate in nm.

10. The polarizing plate according to claim 1, wherein the protective film comprises a material selected from the group consisting of triacetyl cellulose, polyester, cycloolefin polymer, polycarbonate, polyethersulfone, polysulfone, polyamide, polyimide, polyolefin, polyarylate, polyvinyl alcohol, polyvinyl chloride, polyvinylidene chloride films, and combinations thereof.

11. The polarizing plate according to claim 1, further comprising a hard coating layer on a side of the protective film opposite from the polarizer.

12. The polarizing plate according to claim 1, further comprising an isotropic film between the polarizer and the stack structure.

13. The polarizing plate according to claim 12, wherein the isotropic film comprises a material selected from the group consisting of cycloolefin polymer (COP), cellulose, polyester, polycarbonate, polyethersulfone, polysulfone, polyamide, polyimide, polyolefin, polyarylate, polyvinyl alcohol, polyvinyl chloride, polyvinylidene chloride films, and combinations thereof.

14. The polarizing plate according to claim 1, wherein the polarizing plate has a thickness of about 80 μm to about 130 μm.

15. An optical display comprising the polarizing plate according to claim 1.

16. A polarizing plate for an organic light emitting diode (OLED) display, the polarizing plate comprising:
a polarizer;
a protective film on a first side of the polarizer; and
a stack structure comprising a λ/4 reverse dispersion retardation film and a positive C plate on a second side of the polarizer,
wherein a front retardation (Ro) of the stack structure at a wavelength of 550 nm is about 130 nm to about 145 nm with respect to a transmission axis of the λ/4 reverse dispersion retardation film at a lateral viewing angle of −75° to +75°, and
wherein the front retardation (Ro) of the stack structure at a wavelength of 550 nm is about 145 nm to about 165 nm with respect to an absorption axis of the λ/4 reverse dispersion retardation film at lateral viewing angles between −75° and 0° and between 0° and +75°.

* * * * *